United States Patent [19]

Halbert, III

[11] Patent Number: 4,985,872
[45] Date of Patent: Jan. 15, 1991

[54] SEQUENCING COLUMN SELECT CIRCUIT FOR A RANDOM ACCESS MEMORY

[75] Inventor: John B. Halbert, III, Aloha, Oreg.

[73] Assignee: VLSI Technology, Inc., San Jose, Calif.

[21] Appl. No.: 376,302

[22] Filed: Jun. 23, 1989

[51] Int. Cl.$^5$ ............................................. G11C 8/04
[52] U.S. Cl. .............................. 365/230.09; 365/240; 365/189.12
[58] Field of Search ...................... 365/78, 189.12, 220, 365/230.09, 239, 240, 230.06

[56] References Cited

U.S. PATENT DOCUMENTS 4,680,738  7/1987  Tam ...................................... 365/239
4,870,621  9/1989  Nakada ............................ 365/220 X Primary Examiner—Joseph A. Popek
Attorney, Agent, or Firm—Dellett, Smith-Hill and Bedell

[57] ABSTRACT

A sequencing column select circuit for a random access memory includes a decoder that decodes a column address to produce an output word having one bit asserted. The decoder transmits its output word through a first set of gates controlled by a STREAM signal to a recirculating shift register and to an output driver circuit. The shift register also supplies an output word to the output driver circuit through a second set of gates controlled by a !SHIFT signal. In response to an input word from either the shift register or the column decoder, the driver circuit produces output signals selecting memory cell columns for read or write access. When the STREAM signal is on and the !SHIFT signal is off, the decoder output word controls column selection in accordance with the column address. When the STREAM signal is off, the shift register bit shifts the driver circuit input in response to each occurrence of the !SHIFT signal so that a next column of the array is selected.

17 Claims, 4 Drawing Sheets

SEQUENCING COLUMN SELECT CIRCUIT FOR A RANDOM ACCESS MEMORY

BACKGROUND OF THE INVENTION

The present invention relates in general to random access memories and in particular to a circuit for sequentially selecting memory cell columns in a random access memory.

A typical random access memory (RAM) includes an array of rows and columns of memory cells, each cell storing a data bit. During either a memory read or write cycle, input data conveying row and column addresses identify the row and column of the particular memory cell with respect to which it is desired to read out or store a data bit. Each column of memory cells uses a pair of "bit lines" to convey a data bit between cells of the column and the data input and output circuits. Gates driven by a row address decoder connect only one cell in each column to the column bit lines, and gates controlled by a column address decoder connect only the bit lines of one column to the data input and output circuits. Thus, during a read or write cycle, bit lines couple only the single memory cell residing in the addressed row and column to an output or input circuit and only that single memory cell transmits or receives a data bit.

To limit the size of a bus accessing the memory, row and column addresses are usually sent to the memory sequentially over the same address lines. The row address may be placed on the address bus first and then latched onto the row address decoder input terminals in response to an input row address strobe signal. The column address is then placed on the address bus and applied to the column select circuit input terminals in response to an input column address strobe signal.

In many applications, data bits stored in cells along one row are read or written sequentially. For example, a video display may be organized into an array of pixels, and pixel data stored in successive memory cells along each row of a video RAM may control color of successive pixels in a corresponding row of the display. To refresh a display, the data bits stored in cells along each memory array row are read out to a video driver in serial fashion. To speed up memory addressing when sequentially accessing memory cells along a row, the processor or other device accessing the memory provides the row address only once to the memory to select the row being accessed, and then sends a sequence of column addresses to the memory without changing the row address. By progressively incrementing the column address, cells along the selected row are selected sequentially for read or write access.

Typically, a processor or other device loads a starting column address into a programmable counter. Thereafter, during each memory access cycle, the counter increments and transmits the column address to the column address decoder. This system eliminates the need to send new row and column addresses to the memory during each memory access cycle; however, the time required to load and activate the counter adds to total memory access time, and the large number of gates required to implement the circuitry can require significant amounts of chip space and power.

SUMMARY OF THE INVENTION

The present invention relates to a column select circuit for a random access memory formed by an array of M+1 rows and N+1 columns of memory cells. To select a particular memory cell for read or write access, a row address decoder circuit selects the row and the column select circuit selects the column containing the particular cell. The column select circuit generates N+1 bit output signals, each signal corresponding to a separate array column, with only one signal being asserted at any given moment to select the corresponding column.

In accordance with an embodiment of the present invention, a select circuit, e.g. the column select circuit, includes a decoder for translating input column address data to produce an N+1 bit output word having one bit asserted, the position of the asserted bit depending on the column address value. The N+1 bit output word is passed through a first set of gates operated by a first control signal herein called the STREAM signal to input/output terminals of a parallel in-parallel out, recirculating shift register, as well as to input terminals of an output driver circuit. The shift register alters the N+1 bit output word by shifting all bits in one direction except for a bit in a last bit position which is "wrapped around" to a first bit position. The shift register supplies the N+1 bit output word to the output driver circuit through a second set of gates responsive to a second control signal herein called a !SHIFT signal. In response to an input word from either the shift register output or the column decoder, the output driver circuit supplies the column select output signals.

In accordance with one aspect of the present invention, when the STREAM signal is asserted and the !SHIFT signal is not asserted, the column select circuit operates in a "stream" mode. In this mode, the first set of gates connects the decoder output to the driver circuit input while the second set of gates isolates the shift register output from the driver circuit input. Thus, the decoder output word directly controls column selection in response to the current value of the column address.

In accordance with a further aspect of the present invention, when the STREAM signal is deasserted the column select circuit enters a "serial" mode of operation. Thereafter, on each occurrence of the !SHIFT signal, the shift register shifts the data word at the driver input so that a next column of the array is selected. Thus, by deasserting the STREAM signal after addressing a desired memory cell and thereafter repetitively pulsing the !SHIFT signal, a processor or other device can serially access memory cells along any desired memory cell row starting with a desired cell, without having to generate new row or column addresses during each memory access.

It accordingly an object of the present invention to provide an improved, high-speed, low power circuit for sequentially selecting columns of a memory cell array starting with a column identified by an input column address.

The concluding portion of this specification particularly points out and distinctly claims the subject matter of the present invention. However, those skilled in the art will best understand both the organization and method of operation of the invention, together with further advantages and objects thereof, by reading the following description in view of the accompanying drawings wherein like reference characters refer to like elements.

DESCRIPTION OF THE PREFERRED EMBODIMENT

The present invention relates to a circuit for sequentially selecting memory cell columns of a random access memory (RAM). To aid in understanding the purpose of the column select circuit, details of RAM construction and operation are first described hereinbelow.

Figure 1:
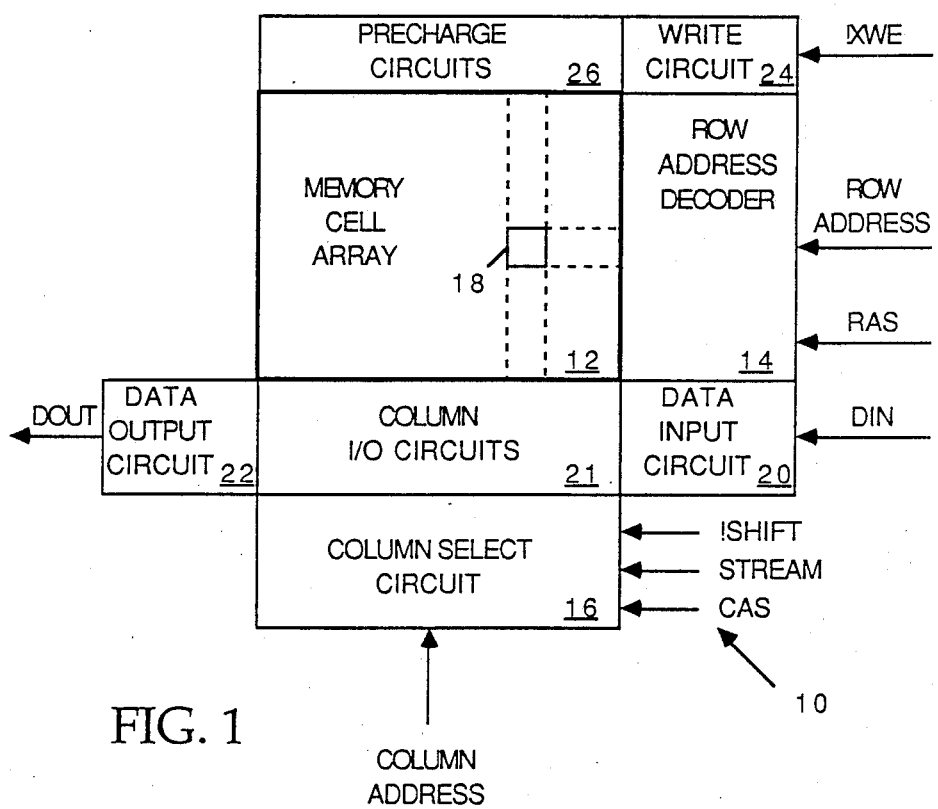
FIG. 1 is a block diagram of a random access memory employing a sequencing column select circuit in accordance with the present invention.

Referring to FIG. 1, a RAM 10 includes a rectangular array 12 of rows and columns of memory cells. Since each memory cell stores a single bit, RAM 10 stores one bit in each of $M+1 \times N+1$ addressable memory cells where $M+1$ is the number of cell rows and $N+1$ is the number of cell columns. During a memory read or write cycle, a row address decoder 14 decodes an input row address to select one row of memory cells of array 12 in response to a row address strobe signal (RAS). A column select circuit 16 in accordance with the present invention decodes input column address data in response to a column address strobe signal (CAS). The cell 18 residing in both the selected row and column then stores or reads out an input or output bit.

RAM 10 also includes a set of column I/O circuits 21. Each column I/O circuit provides data read and write access to the memory cells of a corresponding column in response to column select circuit 16 which selects a cell column by activating the corresponding column I/O circuit. During a write cycle, data input circuit 20 transmits a data bit from an external bus through the activated column I/O circuit 21 to all memory cells of the column. However, only the particular memory cell 18 included in both the selected row and the selected column stores the bit. During a read cycle, the activated column I/O circuit 21 transmits a bit stored in the selected memory cell 18 to an external bus via a data out circuit 22.

Memory 10 further includes a set of precharge circuits 26, one corresponding to each array column. Each precharge circuit 26 controls loading of "bit lines" for conveying data bits between the activated column I/O circuit 21 and the row addressed cell of the selected cell column during a memory read or write operation. An input write enable signal !XWE supplied to a write circuit 24 determines whether each precharge circuit 26 loads the bit lines for a read cycle or a write cycle.

Figure 2:
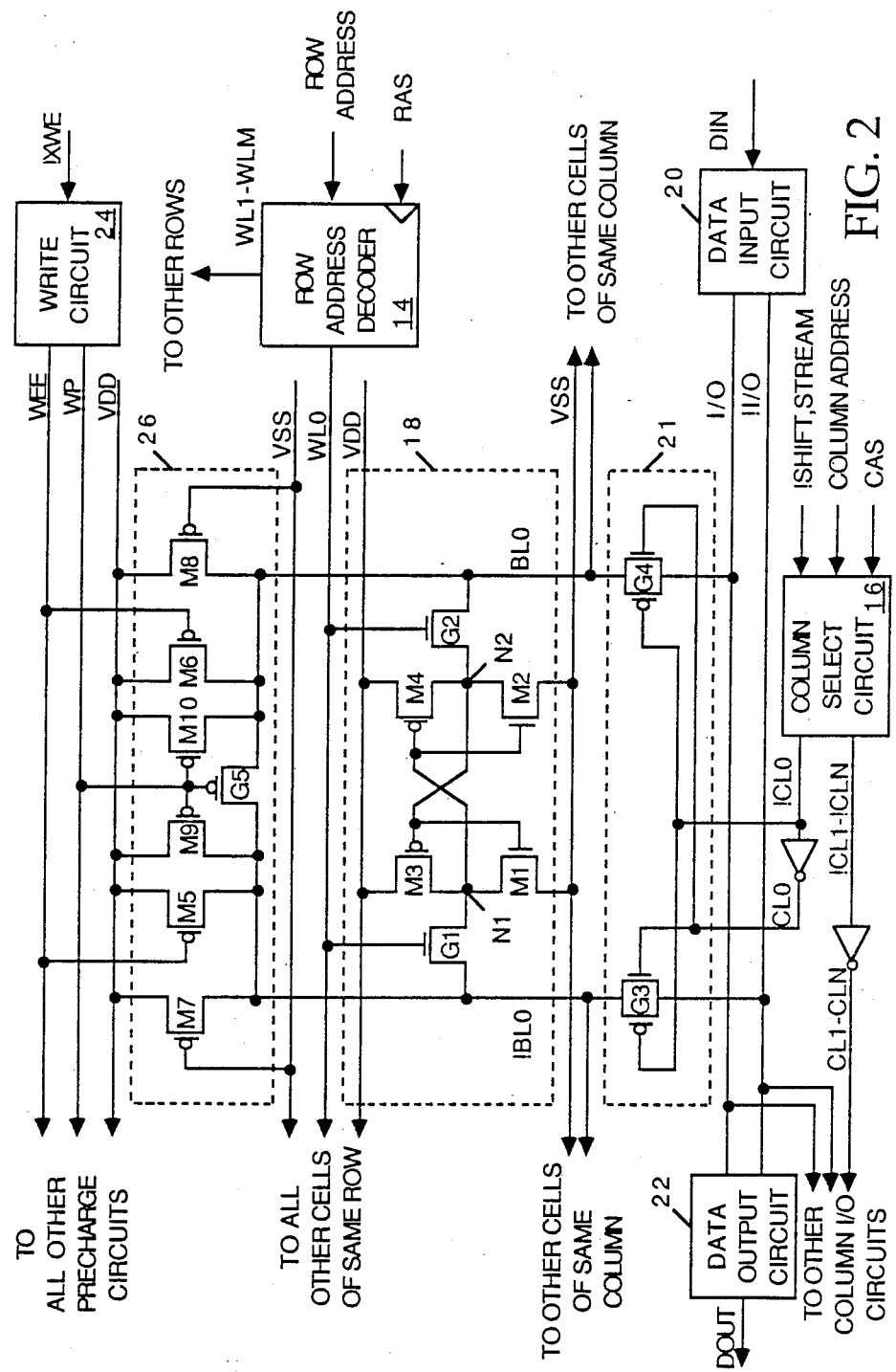
FIG. 2 is a combined block and schematic diagram showing in more detail a portion of the memory of FIG. 1.

FIG. 2 illustrates in more detail a portion of memory 10 including one memory cell 18 residing in row 0 and column 0, along with the I/O circuit 21 and precharge circuit 26 for column 0. Memory cell 18 includes a set of six MOS switching transistors G1, G2 and M1–M4. The drains of p-channel (pMOS) transistors M3 and M4 are tied to a high logic level voltage source VDD, and the sources of n-channel (nMOS) transistors M1 and M2 are tied to a low logic level voltage source VSS. The gate of transistor M4, the source of transistor M3 and the drain of transistor M1 are interconnected at a node N1, while the gate of transistor M3, the source of transistor M4 and the drain of transistor M2 are interconnected at a node N2. The drain and source of nMOS pass gate transistor G1 are respectively connected to node N1 and a bit line !BL0, with the drain and source of nMOS pass gate transistor G2 being respectively connected to node N2 and a second bit line BL0. The BL0 and !BL0 lines couple to all memory cells of column 0.

A word line signal WL0 produced by row address decoder 14 controls the gates of transistors G1 and G2 and similar transistors of all other cells of row 0. Other word line signals WL1–WLM control gates of similar transistors associated with cells residing in other rows. During a read or write access cycle, decoder 14 drives WL0 high, when the row address references row 0, and drives WL0 low when the row address references another array row. When WL0 is high, pass gate transistors G1 and G2 respectively couple bit lines !BL0 and BL0 to nodes N1 and N2 wherein the relative potential between nodes N1 and N2 determines the state of a bit stored in cell 18. The stored bit is high if N2 is high and N1 is low. Conversely, the stored bit is low if N1 is high and N2 is low. When G1 and G2 are on, cell 18 attempts to bias bit lines BL0 and !BL0 to a polarity matching the polarity across nodes N1 and N2. However, during a write cycle, bit lines BL0 and !BL0 may be biased to an opposite polarity by data input circuit 20 having a more powerful output stage, and in such event the memory cell changes the state of its stored bit.

The precharge circuit 26 corresponding to array column 0 includes pMOS transistors G5 and M5–M10. The drains of transistors M5–M10 are tied to VDD and the sources of transistors M5, M7, and M9 are connected to !BL0, while the sources of transistors M6, M8 and M10 are connected to BL0. The drain and source of pass gate transistor G5 are connected to !BL0 and BL0. Write circuit 24 produces a write enable signal WEE in response to !XWE to drive the gates of transistors M5 and M6. Write circuit 24 also produces a write precharge clock signal WP controlling the gates of transistors M9, M10 and G5. The WP and WEE signals are supplied in common to all precharge cells of the memory. Transistors M7 and M8, the gates of which are connected to VSS, are relatively small and are always on to provide a relatively large load impedance between VDD and the bit lines. Transistors M5 and M6 turn on during read cycles to provide additional load current through the bit lines. Transistors M9, M10 and G5 briefly turn on after the end of a write cycle in order to precharge the inherent capacitance of the bit lines.

I/O circuit 21 comprises a complementary MOS (CMOS) pass gate transistor G3 connected between bit line !BL0 and a data input/output line !I/O, and a CMOS pass gate transistor G4 connected between bit line BL0 and a data input/output line I/O. Input/output lines !I/O and I/O are supplied in common to all column I/O circuits 21 of the array. The column select circuit 16 produces an $N+1$ bit output data word (!CL0 . . !CLN) in response to the column address and each bit !CLx of the column select circuit output word is inverted by a separate CMOS inverter to produce inverted control bit CLx, where "x" is any number from 0 to N. The !CLx and CLx bits control pass gates G3 and G4 of column x. When the column address references array column 0 including memory cell 18, the column select circuit 16 drives !CL0 low, thereby causing pass gate transistors G3 and G4 for column 0 to couple bit lines !BL0 and BL0 to input/output lines !I/O and I/O. Column select circuit 16 drives all other bits of its output word high so that I/O circuits 21 isolate bit lines of the other columns from input/output lines !I/O and I/O.

During a write cycle, the external write enable signal !XWE is driven low and write circuit 24 responds by driving WEE high to turn off transistors M5, M6, M9 and M10 of every precharge circuit 26. Write circuit 24 also holds WP high during the write cycle whereby transistors M9, M10 and G5 are also off. The row address decoder 14 drives one WL0–WLM signal high to turn on pass gate transistors G1 and G2 of the selected row and drives all other WL0–WLM outputs low and the column select circuit 16 drives !CLx of a selected column x low to turn on pass gate transistors G3 and G4 while non-addressed column decoders drive their !CLx outputs high. While pass gate transistors G1 and G2 in one cell of each column couple that cell's N1 and N2 nodes to the bit lines of the column, pass gate transistors G3 and G4 of only one addressed I/O circuit 21 couple its bit lines to the input/output lines !I/O and I/O. Thus, nodes N1 and N2 of only a single addressed cell of the array are coupled to !I/O and I/O during the write cycle. An I/O line driver in data input circuit 20 is more powerful than transistors M3 or M4 of cell 18 and transistors M7 and M8 of precharge circuit 26 so that as data input circuit 20 pulls down either line !I/O or line I/O, depending on the state of input data bit DIN, data input circuit 20 also pulls down one of nodes N1 and N2 of the addressed memory cell 18, the other node being driven near VDD. Thus, at the end of the write cycle when transistors G1 and G2 turn off to disconnect memory cell 18 from the bit lines, the state of the bit stored by cell 18 represents the state of the DIN bit supplied to data input circuit 20.

During a read cycle, column select circuit 16 turns on transistors G3 and G4 of a single addressed array column, and row address decoder 14 turns on transistors G1 and G2 of each cell in a single addressed array row. However, write circuit 24 drives WEE low to turn on transistors M5 and M6 of every precharge circuit 26. One of transistors M1 or M2 of each memory cell of the array is on and the other is off. Depending on which transistor M1 or M2 is on, one of nodes N1 and N2 is near VSS and the other is near VDD. The data output circuit 22 sets the state of its output bit DOUT in accordance with the state of an input bit conveyed on the I/O and !I/O lines, in turn determined by bias across the single bit line pair of the addressed column connected to the I/O and !I/O lines through transistors G3 and G4.

In accordance with the present invention, the column select circuit 16 operates in either a "stream" or "serial" mode as selected by an externally generated signal called a STREAM signal. When the input STREAM signal is high, the column select circuit 16 operates in the stream mode as a conventional column address decoder, decoding the column address to produce an N+1 bit data word !CL0 . . !CLN for the column I/O circuits 21. The column select circuit 16 asserts only one bit of its output word !CL0 . . !CLN at any given time, the bit being asserted depending entirely on the current value of the column address. As discussed hereinabove, the particular bit being asserted determines which column is selected for read or write access.

In many applications, data bits stored in cells along one row are read or written sequentially. For example, a video display may be organized as an array of pixels, and pixel data stored in successive memory cells along each row of a video RAM may control color of successive pixels in a corresponding row the display. To refresh a display, the pixel data bits stored in cells along each memory array row are read out to a video driver in serial fashion.

The serial mode of column select circuit 16 operation permits quick serial read or write access to the cells along any given row. To enter the serial mode, the STREAM signal is driven low and the column select circuit 16 initially selects the column last referenced by the column address before the circuit entered the serial mode. But on each subsequent assertion of an externally generated signal herein called a !SHIFT signal, column select circuit 16 bit shifts its output word by one bit position, with the bit in the last bit position of the word being wrapped around to provide the first bit of the word. Whenever the !SHIFT signal is asserted, a next successive column of the memory is selected for a read or write access. By repetitively pulsing the !SHIFT signal while the column select circuit is in the serial mode of operation, a processor or other device can serially read or write access a sequence of memory cells along any addressed memory cell row in the array without having to re-address the memory during each memory access cycle.

Figure 3:
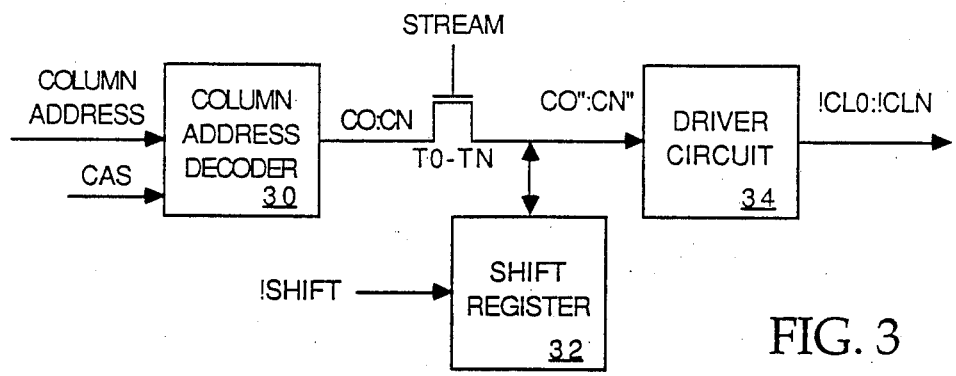
FIG. 3 is a block diagram of the sequencing column select circuit of FIG. 1.

FIG. 3 further illustrates the column select circuit 16 of FIG. 2 which suitably comprises a conventional decoder 30 for decoding the column address to produce an N+1 bit output word (C0 . . CN). Not more than one bit of output word C0 . . CN is driven low in response to any particular column address value and the position of this bit identifies the selected column. The STREAM signal controls the gate of each of a set of N+1 pMOS pass gate transistors T0–TN, each coupling a separate bit of the C0 . . CN word to a corresponding circuit node C0″–CN″. Each node C0″–CN″ is connected to a separate input/output terminal of a parallel in-parallel out, recirculating shift register 32 and to a separate input terminal of an inverting driver circuit 34. The driver circuit 34 generates each column select circuit output signal !CL0–!CLN, inverting a corresponding data bit at one of its input terminals.

Shift register 32 includes keeper circuits that hold the bits at circuit nodes C0″–CN″ at their current logic levels when transistors T0–TN turn off at the beginning of serial mode operation. Thus, the last produced decoder 30 output word before start of serial mode operation stays at nodes C0″–CN″ and continues to control column selection via driver circuit 34 until the !SHIFT signal is asserted. Thereafter, on each assertion of the !SHIFT signal, shift register 32 bit shifts the word on nodes C0″–CN″ to drive the bit at each node C(x+1)″ low when the bit at node Cx″ was previously held low. The shift register recirculates the bit at node CN″ to node C0″.

Figure 4:
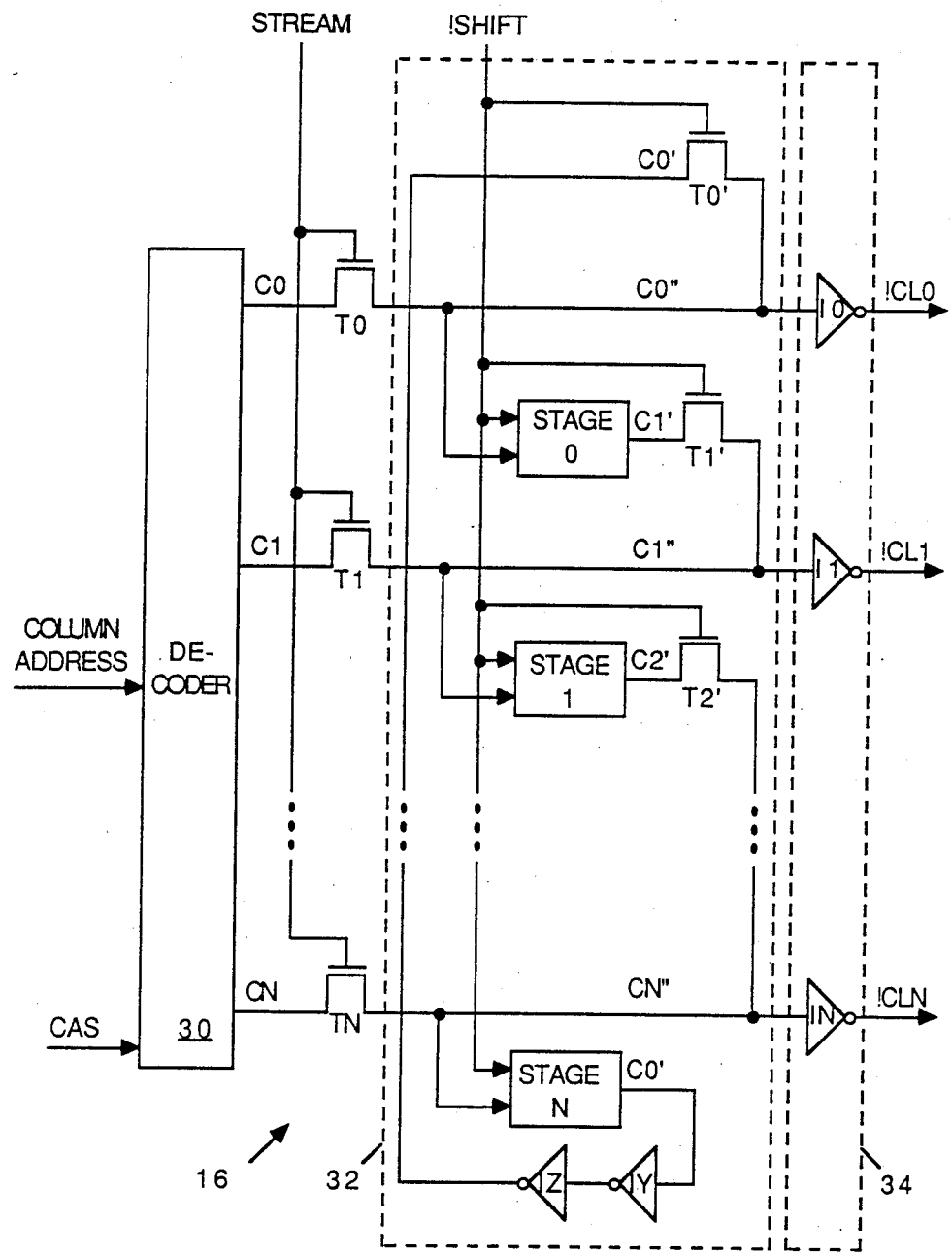
FIG. 4 is a combined block and schematic diagram illustrating the sequencing column select circuit of FIG. 3 in more detail.

FIG. 4 is a combined block and schematic diagram illustrating the sequencing column select circuit of FIG. 3 in greater detail. Driver circuit 34 comprises a set of CMOS inverters I0–IN each of which inverts an input bit at corresponding node C0″–CN″ to produce a separate column select output signal. Shift register 32 includes a set of N+1 stages 0–N, each comprising a transparent latch delivering an input bit to its output when the !SHIFT signal is low, and then isolating its input from its output on the rising edge of the !SHIFT signal. The stages C0'''' are connected in a loop with the output Cx' of each stage x-1 (other than stage N) connected to the input node Cx'' of a next stage, x through a corresponding pMOS pass gate transistor T, the output C0' of stage N being coupled back to input node C0'' of stage 0 though a pair of CMOS inverters IY and IZ and a pMOS pass gate transistor T0'. (In the preferred embodiment, stage N and transistor T0' are physically separated on the integrated circuit whereby inverters IY and IZ are provided to decrease the charging time of inherent capacitance of the conductor connecting stage N and transistor T0'). The !SHIFT signal controls the gate of each transistor T0'-TN' such that when the !SHIFT signal is driven low, each transistor T0'-TN' turns off, disconnecting the output of each stage 0-N from the input to driver 34 and from the next stage input.

During the stream mode of operation, the STREAM signal is held high to turn on pass gate transistors T0-TN so that the N+1 bit decoder 30 output word C0 .. CN controls the driver 34 input. The shift register 32 bit "shifts" the output word C0 .. CN to supply an output word C0' .. CN' at the stage 0-N outputs but the !SHIFT signal is held continuously low for holding transistors T0'-TN' off and preventing C0' .. CN' from driving the inverters. Thus, the current value of the column address directly controls the column select circuit output word !CL0 .. !CLN, and any change in the column address quickly provides a corresponding change in selected memory array column.

To initiate the serial mode of operation after decoder 30 has supplied an input word C0 .. CN to shift register 32 in response to a column address, the STREAM signal is driven low to turn off transistors T0-TN, thereby disconnecting decoder 30 from inverter input nodes C0''-CN''. Each stage 0-N of the shift register includes a regenerative input circuit that holds the inverter input nodes at their current logic levels. Thus, the column select output word !CL0 .. !CLN remains unchanged until the !SHIFT signal is asserted. When the !SHIFT signal is asserted to connect the stage 0-N output word C0' .. CN' to the driver 34 inputs, the output word !CL0 .. !CLN from driver 34 is bit-shifted by one position. Thereafter, as the !SHIFT signal is deasserted and then re-asserted, the shift register 32 again supplies its bit shifted output word to driver 34 causing the driver to assert (drive low) a next bit of its output word !CL0 .. !CLN.

Thus, on entering the serial mode, the memory cell array column identified by the input column address is selected, and on each subsequent assertion of the !SHIFT signal, a next column of the memory cell array is selected. When the STREAM signal is once again driven high with the !SHIFT signal held low, the column select circuit 16 reverts to the stream mode of operation wherein column selection is directly controlled by the column address.

Figure 5:
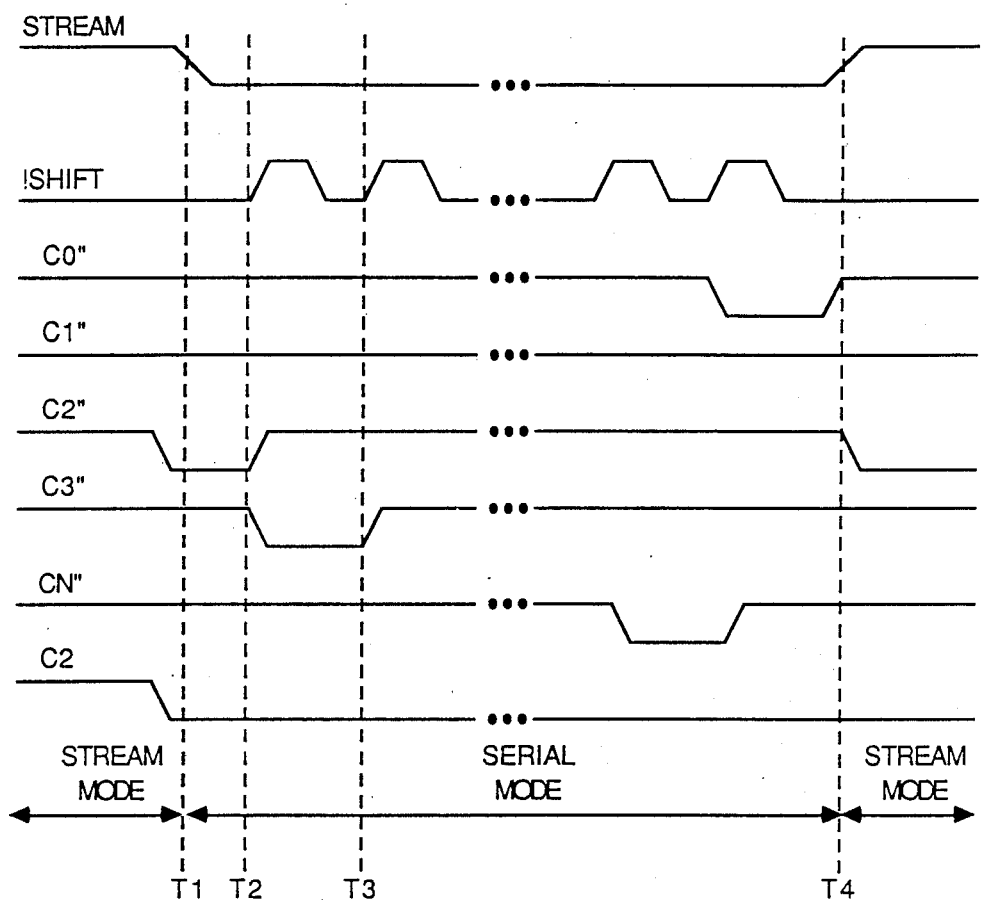
FIG. 5 is a timing diagram illustrating behavior of various signals in the circuit of FIG. 4.

FIG. 5 is a timing diagram illustrating an example operation of the column select circuit 16 of FIG. 4. Referring to FIGS. 4 and 5, the column select circuit 16 is initially operated in the stream mode with the STREAM signal held high and the !SHIFT signal held low. When, for example, the C2 output bit of decoder 30 is driven low in response to a column address value identifying array column 2, the C2 output bit drives inverter I2 and stage 2 input node C2'' low because gate T2 is on. The signals at all other nodes C0'', C1'', and C3''-CN'' are driven high since corresponding output bits of decoder 30 are high.

At time T1, the STREAM signal is driven low to place the column select circuit 16 in the serial mode and transistors T0-TN turn off to disconnect the decoder output word C0..CN from the inverter inputs. However, the regenerative input circuit of stage 2 continues to hold node C2'' low. Thereafter, at time T2, the !SHIFT signal is driven high causing transistors T0'-TN' to place the stage 0-N output word on nodes C0''-CN''. Since only stage 2 had a low input when the !SHIFT signal was asserted at time T2, only node C3'' is then driven low while node C2'' goes high. At time T3, the !SHIFT signal is re-asserted. C3'' is now driven high and C4'' (not shown) is driven low with the process continuing with !SHIFT signals until CN'' is driven low. On the next assertion of the !SHIFT signal, CN'' goes high again and C0'' is driven low.

When external control circuits assert the STREAM signal again at time T4, the column select circuit 16 returns to the stream mode wherein transistors T0-TN are on and connect decoder 30 to nodes C0''-CN''. The !SHIFT signal is low to hold transistors T0'-TN' off, thereby disconnecting the stage 0-N outputs from nodes C0''-CN''. If, as shown in the example, the C2 output bit of decoder 30 is still low, C2'' is driven low.

Figure 6:
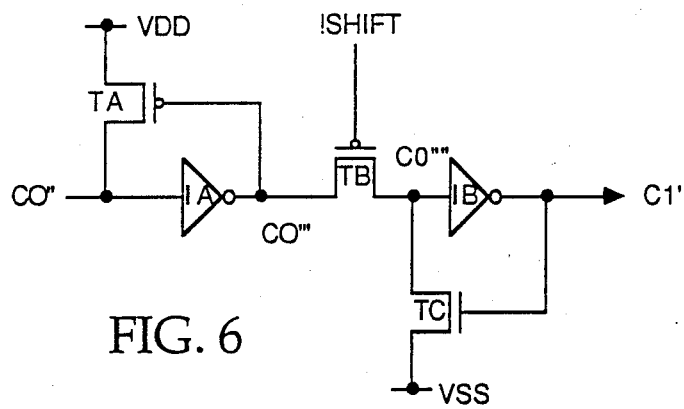
FIG. 6 is a schematic diagram for the stage 0 cell of the circuit of FIG. 4.

FIG. 6 illustrates stage 0 of FIG. 4 in schematic diagram form, it being understood that stages 1-N are similar. An nMOS transistor TA returns input node C0'' to the high logic level voltage source VDD while CMOS inverter IA connects input node C0'' to a node C0''' at the gate terminal of transistor TA. A pMOS pass gate transistor TB controlled by the !SHIFT signal couples node C0''' to a node C0'''' at the input of another CMOS inverter IB. The output of inverter IB is connected to stage output node C1' and to the gate of a pMOS transistor TC coupling node C0'''' to the low logic level voltage source VSS.

Inverter IA and transistor TA operate as a regenerative "keeper" circuit to hold C0'' at its last logic state when both transistors T0 and T0' of FIG. 4 are off. Transistor TB delivers the output of inverter IA to the input of inverter IB when !SHIFT is low. On the rising edge of !SHIFT, transistor TB turns off. However, inverter IB and transistor TC operate as a regenerative keeper circuit to retain the output node C1' of inverter IB at its last state when transistor TB turns off.

As described herein, a column select circuit comprises a decoder that translates a column address to produce an N+1 bit output word supplied as input to a recirculating shift register as well as to an output driver circuit through a first set of gates controlled by a STREAM signal. The shift register additionally supplies an N+1 bit output word to the output driver circuit through a second set of gates operated by a !SHIFT signal. In response to an input word from either the shift register or the column decoder, the output driver circuit provides an N+1 bit output word, each bit controlling the gates connecting bit lines of a separate column to the memory input or output circuits. When the STREAM signal is asserted and the !SHIFT signal is not asserted, the column select circuit operates in the stream mode such that the decoder output word controls the driver circuit. The column select circuit therefore directly determines column selection in accordance with the current value of the column address.

When the STREAM signal is not asserted, the column select circuit operates in the serial mode wherein the shift register latches the last output word of the decoder onto the driver circuit input to select the memory cell column referenced by the column address, and thereafter the shift register shifts the decoder input word upon each assertion of the !SHIFT signal. Thus, by de-asserting the STREAM signal after addressing a desired cell and then repetitively pulsing the !SHIFT signal, a processor or other device can serially address memory cells along any desired memory cell row, starting with the desired cell, without having to generate new row or column addresses during each memory access.

While the foregoing specification has described a preferred embodiment of the present invention, one skilled in the art may make many modifications to the preferred embodiment without departing from the invention in its broader aspects. The appended claims are therefore intended to cover all such modifications as fall within the true spirit and scope of the invention.

I claim:

1. A sequencer circuit for sequentially asserting a set of output signals, starting with an output signal identified by a particular input value, the circuit comprising:
   decoder means for producing a parallel bit output word in response to receipt of said input value;
   a plurality of circuit nodes respectively corresponding to bits of said output word;
   means for concurrently delivering bits of the decoder means output word to respective circuit nodes and for selectively isolating the decoder means output word from said circuit nodes;
   shifting means coupled between circuit nodes corresponding to adjacent bits of said output word for selectively shifting bits of data between said circuit nodes; and
   driver means coupled to said circuit nodes for generating said output signals in response to data at said circuit nodes.

2. A sequencer circuit responsive to first and second input control signals for sequentially asserting a set of output signals, starting with an output signal identified by a particular input value, the circuit comprising:
   decoder means for producing a parallel bit output word in response to said input value wherein said decoder means asserts a given bit of said output word when said input value uniquely identifies that bit;
   a plurality of circuit nodes respectively corresponding to bits of said output word;
   gate means for concurrently delivering bits of the decoder means output word to corresponding ones of said circuit nodes when said first control signal is asserted, and for isolating the decoder means output word from said circuit nodes when the said first control signal in not asserted; and
   shifting means coupled between circuit nodes corresponding to adjacent bits of said output word for shifting the bits of said word between circuit nodes when said second control signal is asserted.

3. The sequencer circuit in accordance with claim 2 further comprising driver means connected to said circuit nodes for generating said output signals in response to the word at said circuit nodes.

4. The sequencer circuit in accordance with claim 2 wherein said shifting means comprises a parallel-in, parallel-out, recirculating shift register.

5. The sequencer circuit in accordance with claim 2 wherein said shifting means comprises a plurality of latch stages, each latch stage corresponding to a separate one of said circuit nodes and latching a bit appearing on the corresponding circuit node to another of said circuit nodes in response to said second control signal.

6. The sequencer circuit in accordance with claim 2 wherein said shifting means comprises a plurality of latch stages, each latch stage corresponding to a separate one of said circuit nodes and comprising:
   a regenerative input circuit for generating a first output bit in response to a first input bit appearing on the corresponding circuit node, and for maintaining a logic level of said first input bit on the corresponding circuit node when said control signals are not asserted;
   second gate means responsive to said second control signal;
   a regenerative output circuit coupled to said regenerative input circuit through said second gate means for receiving said first output bit from said input circuit when said second control signal is not asserted, said second gate means isolating said regenerative input and output circuits from one another when said second control signal is asserted, the regenerative output circuit generating a second output bit in response to said first output bit and maintaining said second output bit at its current state when said second gate means isolates said input and output regenerative circuits; and
   third gate means for coupling said regenerative output circuit to another of said circuit nodes other than said corresponding circuit node, delivering said second output bit to the other circuit node when said second control signal is asserted and isolating said regenerative output circuit from the other circuit node when said second control signal is not asserted.

7. An accessing circuit for a random access memory comprising a plurality of memory cells, said circuit comprising:
   a plurality of circuit nodes adapted to provide select signals along one coordinate of said random access memory;
   decoder means for producing an output word in response to an address identifying a said node along said one coordinate of said memory; and
   means for delivering bits of said output word to respective circuit nodes for controlling access to cells of said random access memory along said one coordinate of said memory, including selectively operable shift register means coupled to said circuit nodes for sequentially shifting said bits of said output word relative to said coordinate to sequentially access ones of said memory cells by providing a sequence of select signals thereto.

8. A column select circuit for a random access memory responsive to first and second control signals for sequentially asserting column select signals commencing with a column select signal identified by an input column address, the circuit comprising:
   a plurality of circuit nodes, one circuit node corresponding to each column select signal;
   decoder means for producing an output word in response to the column address, a separate bit of said output word being asserted when the column address has a value uniquely corresponding to that bit;

first gate means responsive to the first control signal signal for concurrently delivering bits of the decoder means output word to corresponding circuit nodes when the first control signal is asserted, and for isolating the decoder means output word from the circuit nodes when the first control signal is not asserted; and a recirculating shift register coupled to said circuit nodes for receiving the decoder means output word and for maintaining the decoder means output word on said circuit nodes after said first control signal is de-asserted and thereafter bit shifting the word on said circuit nodes when said second control signal is asserted.

9. The circuit in accordance with claim 8 further comprising driver means connected to said circuit nodes for generating said column select signals in response to the word on said circuit nodes.

10. The circuit in accordance with claim 8 wherein said shift register comprises a plurality of latch stages, each latch stage corresponding to a separate one of said circuit nodes and latching a bit appearing on the corresponding circuit node to another of said circuit nodes in response to said second control signal.

11. The sequencer circuit in accordance with claim 8 wherein said shift register comprises a plurality of latch stages, each latch stage corresponding to a separate one of said circuit nodes and comprising:

a regenerative input circuit for generating a first output bit in response to a first input bit appearing on the corresponding circuit node, and for maintaining a logic level of said first input bit on the corresponding circuit node when said first and second control signals are not asserted;

second gate means controlled by said second control signal;

a regenerative output circuit coupled to said regenerative input circuit through said second gate means for receiving said first output bit from said input circuit when said second control signal is not asserted, said second gate means isolating said regenerative input and output circuits from one another when said second control signal is asserted, the regenerative output circuit generating a second output bit in response to said first output bit and maintaining said second output bit at its current state when said second gate means isolates said input and output regenerative circuits; and third gate means for coupling said regenerative output circuit to another of said circuit nodes other than said corresponding circuit node and delivering said second output bit to said another of said circuit nodes when said second control signal is asserted and for isolating said regenerative output circuit from said another circuit node when said second control signal is not asserted.

12. A recirculating parallel in, parallel out shift register comprising:

a plurality of circuit nodes for receiving a parallel input word;

a plurality of latch stages, each latch stage corresponding to a separate one of said circuit nodes, each latch stage comprising:

a regenerative input circuit for generating a first output bit in response to a first input bit appearing on the corresponding circuit node, and for maintaining said first input bit on the corresponding circuit node when said input word is disconnected from said circuit nodes;

gate means controlled by an externally generated control signal;

a regenerative output circuit coupled to said regenerative input circuit through said gate means for receiving said first output bit from said input circuit when said control signal is not asserted, and being isolated from said regenerative input circuit by said gate means when said control signal is asserted for generating a second output bit in response to said first output bit and for maintaining said second output bit when said gate means isolates said input and output regenerative circuits; and second gate means responsive to said control signal for coupling said regenerative output circuit to said corresponding circuit node for delivering said second output bit to another of said circuit nodes corresponding to a next of said latch stages when said control signal is asserted but isolating said regenerative output circuit from said another of said circuit nodes when said control signal is not asserted.

13. A memory comprising:

an array comprising rows and columns of memory cells with each memory cell being included in one row and one column, each memory cell storing a data bit;

means responsive to input row select signals wherein each row select signal references a separate one of said rows when asserted, and responsive to input column select signals, wherein each column select signal references a separate one of said columns when asserted, for read accessing a particular memory cell included both in a row referenced by the asserted row select signal and in a column referenced by the asserted column select signal;

a plurality of circuit nodes, one corresponding to each column select signal;

column address decoder means for producing a multiple bit output word in response to an input column address, each separate bit of said output word being asserted only when the column address has a value uniquely corresponding to that bit;

first gate means responsive to assertion of a first input control signal for concurrently delivering each bit of the decoder means output word to a corresponding one of said circuit nodes, and for isolating the column address decoder means output word from the circuit nodes when said first input control signal is not asserted;

bit shifting means coupled to said circuit nodes for bit shifting the word on said circuit nodes when a second control signal is asserted; and driver means connected to said circuit nodes for generating said column select signals, said driver means asserting each said column select signal when a corresponding bit of the word on said circuit nodes is asserted.

14. The memory in accordance with claim 13 wherein said bit shifting means comprises a recirculating shift register.

15. The memory in accordance with claim 13 wherein said bit shifting means comprises a plurality of latch stages, each latch stage corresponding to a separate one of said circuit nodes and latching a bit appearing on the corresponding circuit node to another of said circuit nodes in response to said second control signal.

16. The memory circuit in accordance with claim 13 wherein said bit shifting means comprises a plurality of latch stages each latch stage corresponding to a separate one of said circuit nodes and comprising:
- a regenerative input circuit for generating a first output bit in response to a first input bit appearing on a circuit node and for maintaining said first input bit on that circuit node when said first and second control signals are not asserted;
- second gate means controlled by said second control signal;
- a regenerative output circuit coupled to said regenerative input circuit through said second gate means for receiving said first output bit from said input circuit when said second control signal is not asserted while being isolated from said regenerative input circuit by said second gate means when said second control signal is asserted, and for generating a second output bit in response to said first output bit and maintaining said second output bit at its current state when said second gate means isolates said input and output regenerative circuits; and
- third gate means responsive to said second control signal for coupling said regenerative output circuit to another of said circuit nodes other than said corresponding circuit node and delivering said second output bit to said another of said circuit nodes when said second control signal is asserted but isolating said regenerative output circuit from said another of said circuit nodes when said second control signal is not asserted.

17. A method for sequentially providing a set of output signals, starting with a first output signal identified by input data, the method comprising the steps of:
- decoding the input data to determine a first output signal comprising a multiple bit word having a bit thereof asserted;
- applying the multiple bit word as input to driver means; and
- bit shifting the multiple bit word as applied as input to the driver means such that the driver means asserts another of said set of output signals.

* * * * *